United States Patent [19]
Kouzuchi et al.

[11] Patent Number: 4,775,916
[45] Date of Patent: Oct. 4, 1988

[54] PRESSURE CONTACT SEMICONDUCTOR DEVICE

[75] Inventors: Shigeyasu Kouzuchi, Ibaraki; Shuroku Sakurada, Katsuta; Tadashi Sakaue; Masafumi Ono, both of Hitachi, all of Japan

[73] Assignees: Hitachi Ltd.; Hitachi Haramachi Semi-Conductor Ltd., both of Tokyo, Japan

[21] Appl. No.: 898,597

[22] Filed: Aug. 21, 1986

[30] Foreign Application Priority Data

Sep. 4, 1985 [JP] Japan ................................ 60-193747

[51] Int. Cl.$^4$ .................... H01L 23/32; H01L 23/40
[52] U.S. Cl. .................................. 361/388; 361/389; 174/52 FP; 174/525; 357/76; 357/79
[58] Field of Search ................... 361/388, 389, 386; 357/76, 79, 72, 73; 174/52 FP, 52 S

[56] References Cited

U.S. PATENT DOCUMENTS

| | | | |
|---|---|---|---|
| 3,890,637 | 6/1975 | Yamamoto | 357/74 |
| 4,099,201 | 7/1978 | Mueller | 357/79 |
| 4,188,637 | 2/1980 | Gerstenköper et al. | 357/79 |
| 4,587,550 | 5/1986 | Matsuda | 357/79 |
| 4,646,130 | 2/1987 | Creutz | 357/79 |

*Primary Examiner*—A. D. Pellinen
*Assistant Examiner*—H. L. Williams
*Attorney, Agent, or Firm*—Antonelli, Terry & Wands

[57] ABSTRACT

A pressure contact semiconductor device has a semiconductor substrate disposed on a metal post electrode through metal electrode plate, an insulating ring engaged with the periphery of the metal post electrode extends to the periphery of the metal electrode plate and is brought into contact therewith at a certain height with a sufficient contact pressure. The semiconductor substrate is positioned precisely with respect to the metal post electrode so that a gate electrode ring is precisely positioned on a gate electrode film formed on the upper surface of the semiconductor substrate.

18 Claims, 2 Drawing Sheets

PRESSURE CONTACT SEMICONDUCTOR DEVICE

BACKGROUND OF THE INVENTION

1. Field of the Invention

This invention relates to a pressure contact semiconductor device and, more specifically, to its structure, in which a semiconductor substrate is coupled with a metal post having high thermal conductivity and high electrical conductivity through a metal plate having a thermal expansion coefficient, which is close to that of the semiconductor substrate.

2. Description of the Related Art

A semiconductor device, in particular a high power semiconductor, device requires a structure permitting it the conduction of heat and electricity with a high efficiency. The pressure contact type of semiconductor device structure is a structure by which a metal electrode plate is pushed towards an electrode film formed on a semiconductor substrate, which plate conducts heat and electricity, and is excellent in stability against thermal cycles. Further, it has an advantage that the semiconductor substrate can be easily exchanged. The pressure contact type structure is utilized principally for power semiconductor devices, such as power transistors, thyristors, gate turn off (GTO) thyristors, etc. In order that the semiconductor substrate is not stressed by thermal cycles, it is preferable that the thermal expansion coefficient of the metal element, which is brought directly into contact with the surface of the semiconductor body (including the surface of the electrode film) is as close as possible to that of the semiconductor body. However such a metal cannot be said to have sufficiently high electrical conductivity and thermal conductivity. Therefore a structure, by which compressive force is applied to a metal post superposed on the metal electrode plate made of a material having a thermal expansion coefficient close to that of the semiconductor substrate, has been proposed. The positional relation between different superposed components becomes fixed by accordingly applying compressive force thereto, and using an insulating ring, etc. made of tetrafluoroethylene (teflon), etc. for holding the superposed components safely also before the application of compressive force.

According to JP Utility Model A Sho No 57-69240 assigned to one of the assignees of this application, it discloses protecting the end surfaces of a semiconductor substrate by pouring silicone resin at the end portions of the semiconductor substrate after having engaged an insulating ring therewith. Tetrafluoroethylene and silicone resin are excellent substance for passivation and protection, which can bear such temperatures around storage temperature of the semiconductor device.

For example U.S. Pat. No. 4,500,903 assigned to Hitachi, Ltd., which is one of the assignees of this application, discloses that a number of elongated emitters are arranged in the radial direction in a ring shape, that several such rings are disposed from the central portion to the periphery on the surface of the semiconductor body to obtain a multi-ring structure and that the length of emitter strips is different for different rings in order to control a high current with a high efficiency.

Further, for example, U.S. Pat. No. 3,134,074 assigned to Hitachi Ltd., which is one of the assignees of this application, discloses a structure, by which, in such a multi-ring emitter structure, gate electrode films are disposed between two adjacent emitter rings, which films are brought into contact with gate electrode rings.

Such a gate electrode ring should be positioned precisely on a predetermined portion of the gate electrode. If it is in contact with the cathode-emitter, it gives rise to short circuit and the semiconductor device loses its control function. Even if it is not in contact with the cathode, when it is not in contact with the predetermined portion of the gate electrode, non-uniformity, local concentration of electric current, etc. can result.

SUMMARY OF THE INVENTION

An object of this invention is to provide a pressure contact semiconductor device permitting precise positioning of superposed components by means of an insulating ring.

Another object of this invention is to provide a pressure contact semiconductor device having a reliability ameliorated by positioning with a high precision a metal electrode plate and a metal post electrode, which are adjacent to the semiconductor substrate.

According to one aspect of this invention a metal electrode plate adjacent to a semiconductor substrate and a post electrode for applying compressive force to it, which is adjacent to the metal electrode plate, are mutually positioned by means of an insulating ring made of resilient insulating resin. Consider now the insulating ring divided into two parts, one being $t_1$ thick and the other part $t_2$ thick, according to two components with which it is engaged. The dimensions of the insulating ring are so selected that, when $t_2 < t_1$, the influences produced by engaging the part which is $t_2$ thick with the component inserted therein are sufficiently small at the end portion of the part which is $t_1$ thick. More preferably it is the inner diameters of the two parts that are selected.

In the case where the semiconductor substrate is secured to the metal electrode plate by alloying, etc., the positioning of semiconductor substrate is effected by positioning the metal electrode plate with respect to the post electrode. The metal electrode plate on the other surface can be positioned by using a slot formed in the other post electrode. For example, a gate electrode ring may be inserted in a ring-shaped slot so that the cathode electrode plate is guided by the inner and outer edges of the gate electrode ring.

In the case where the semiconductor substrate is not fixed to the metal electrode plate, the positioning is effected by the fact that an insulating seal made of e.g. silicone resin, etc. covering the periphery of the semiconductor substrate abuts also against the periphery of the metal electrode plate.

When the semiconductor is silicon and the electrode films on the silicon substrate are made of aluminum, from the point of view of the thermal expansion coefficient it is preferable that the metal electrode plates are made of tungsten (W). Here, however, the separation of the metal electrode plates from the Al electrode films may become difficult as a result of long term pressure contact. This separation after a long term use can be guaranteed by inserting a cap made of another metal, e.g. molybdenum (Mo) between the Al electrode film and the W electrode plate.

In order to bring the gate electrode film and the gate electrode ring into contact with a sufficiently large force, they may be brought into contact by forming a slot having a side wall perpendicular to the surface of the post electrode therein, guiding the gate electrode ring by this perpendicular side wall through an insulating body, and using an elastic member such as cup springs thrusted by the post electrode. An insulator such as mica may be used for the insulation of the part to which compressive force is applied.

The other objects, features and advantages of this invention will be understood from the following explanation of embodiments, referring to the drawings.

DESCRIPTION OF THE PREFERRED EMBODIMENTS

Figure 1:
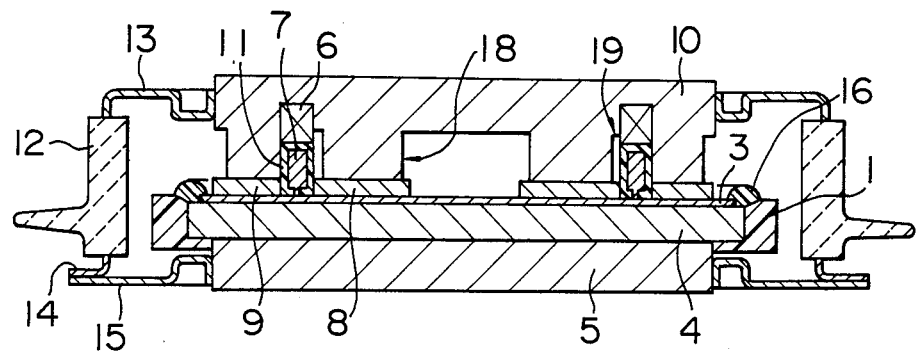
FIG. 1 a cross-sectional view of a GTO thyristor according to an embodiment of this invention.
Figure 2:
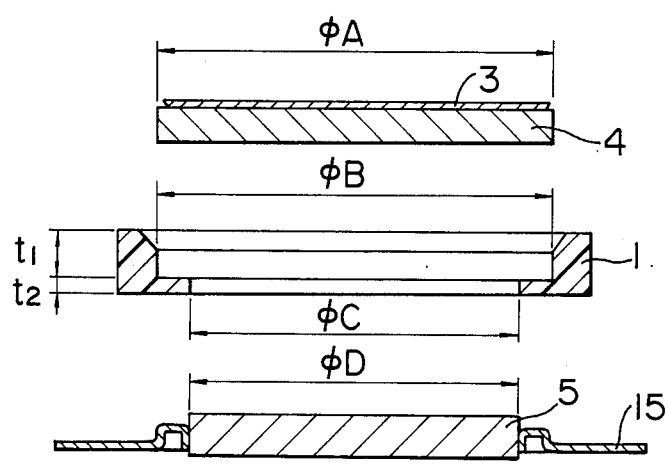
FIG. 2 is an exploded cross-sectional view of a part of the GTO thyristor indicated in FIG. 1.

A GTO thyristor according to an embodiment of this invention will be explained, referring to FIGS. 1 and 2. The general knowledge on the GTO thyristor is disclosed e.g. by U.S. Pat. No. 3,134,074 and U.S. Pat. No. 4,500,903, which are hereby incorporated by reference. In FIG. 1 a semiconductor substrate 3 is held between a pair of post electrodes 5 and 10, to which compressive force is applied, through electrode plates 4, 8 and 9. The side surface of the semiconductor substrate 3 is bevelled and protected by an insulating protection ring 16 made of a material such as silicone resin. The post electrodes 5 and 10 are made of a metal having a high thermal conductivity and a high electrical conductivity, such as Cu, Ni. The electrode plates 4, 8 and 9 are made of a metal having a thermal expansion coefficient approximately equal to that of the semiconductor substrate, such as W when using silicon as the substrate. The possible sticking of the W electrode plate to the Al electrode film may be prevented by intervening a thin plate of another metal such as Mo therebetween. The silicon substrate 3 includes a thyristor structure and has a cathode electrode film and a gate electrode film on its upper surface and an anode electrode film, on its lower surface. The electrode films are typically made of Al. In this embodiment the anode electrode film on the lower surface is alloyed to the anode electrode plate 4, as indicated in FIG. 2. The alloying is effected by heating them to a temperature of about e.g. 800° C.

The post electrode 10 on the upper surface of the silicon substrate 3 has a circular recess 18 at the central portion and a annular recess 19 at a middle portion. The central cut-off portion 18 is formed for generating a uniform pressure at the lower surface of the electrode plate 8, when compressive force is applied from the upper surface of the post 10. A ring-shaped slot 19 at a middle portion is made for taking-in and holding the gate electrode ring 7 therein. The gate electrode film is exposed in the form of a ring at the portion in the upper surface of the silicon substrate 3, which is opposite the gate electrode ring 7. The side surface of the gate electrode ring 7 is covered with an insulating member 11 such as tetrafluoroethylene (teflon), etc. so that it is insulated from the post electrode 10 and the electrode plates 8, 9. The periphery of the insulating member 11 abuts against the inner side surface of the ring-shaped slot 19 and positions precisely the gate electrode ring 7. The gate electrode ring 7 may be a two-layer metal ring, which is made of e.g. Mo at the side of the gate electoode film and Cu at the opposite side. The gate electrode ring 7 is brought into contact with the gate electrode film with pressure by means of a pressurizing mechanism 6 within the slot 19. The pressuring mechanism 6 may be formed of e.g. a plurality of cup springs insulated with mica sheets.

The cathode electrode plates 8 and 9 on the upper surface of the semiconductor substrate 3 are positioned within the upper surface of the semiconductor substrate 3 by means of the gate electrode mechanism 7, 11 at the middle portion. Each of the electrode plates 8, 9 is located e.g. on a plurality of annular rings, each comprising a multiplicity of radially oriented elongated emitter electrode films.

The metal electrode plates 4, 7, 8, 9 may be made of any material, which can be brought electrically and thermally into contact with the electrode films without giving rise to high thermal stress in the semiconductor substrate 3 (in particular silicon substrate), e.g. tungsten, molybdenum, composite material such as copper-carbon etc.

A GTO thyristor made of a silicon substrate having a diameter of e.g. 60 mm may be applied with a force of about 2 tons through the two post electrodes 5 and 10.

The semiconductor substrate 3 is completely insulated from the ambient atmosphere by means of a sealing structure described below. The upper post electrode 10 is silver-soldered to the inner edge of a flange 13, which is silver-soldered at the outer edge to the upper end of a ceramic cylindrical insulator 12. At the lower end of the ceramic insulator 12 another flange 14 is silver-soldered. The lower post electrode 5 is silver-soldered to a flange 15. The flanges 13, 14, 15 may be made of e.g. a Fe-Ni alloy. The flanges 14 and 15 are abutted against each other and hermetically jointed e.g. by argon welding. In this way the relative position of the two post electrodes 5 and 10 is precisely determined.

Figure 3:
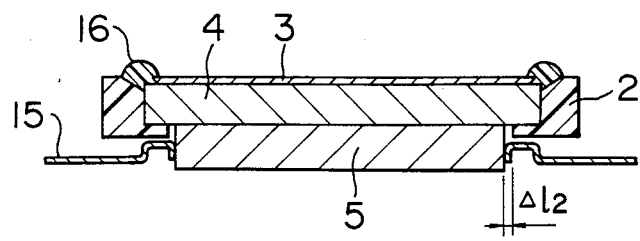
FIGS. 3 and 4 are cross-sectional views of a part of the GTO thyristor for explaining this invention.

The metal plate 4, with which the semiconductor substrate 3 is alloyed, is positioned with respect to the metal post electrode 5 by the insulating resin ring 1. This positioning of the silicon substrate 3 will be described below, referring to FIGS. 2, 3 and 4. The common insulating ring 1 is disposed around the metal disk 4 and the post electrode 5. The metal disk 4, with which the semiconductor substrate 3 is alloyed, is guided by the insulating ring 1 and is positioned relative to the metal post electrode 5. The insulating ring 1 does not have its own separate support, but rather it is supported by the metal disk 4 and the cylindrical post electrode 5. However, depending on the setting of the dimensions of the insulating ring 1, a gap $\Delta l_2$, as indicated in FIG. 3, between the insulating ring 1 extended by the metal disk 4 and the metal post 5 is produced, preventing the precise positioning of the substrate 3. According to the present invention, this gap is avoided as indicated in FIG. 4, even if a slight gap $\Delta l_1$ is produced due to deformation of a part of the insulating ring 1, a complete contact between the insulating ring 1 and the metal disk 4 is guaranteed at a distant position, as well as between the ring 1 and the post 5.

Figure 4:
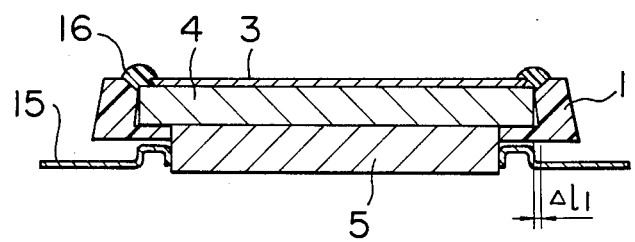

In FIG. 4, due to influences of the portion of the insulating ring 1, into which the metal post 5 is inserted, a part of the portion, into which the metal disk 4 is inserted, is expanded by an amount $\Delta l_1$. However, the portion of the insulating ring 1, into which the metal disk 4 is inserted, has a thickness $t_1$. Therefore, the part, which is away from the metal post electrode 5, is almost not influenced by the expansion, but holds the metal disk 4. This situation will be described below more in detail.

In the structure indicated in FIG. 2, the outer diameter of the metal disk 4 is represented by $\phi_A$; the inner diameter of the insulating ring 1 is represented by $\phi_B$ at the upper portion and by $\phi_C$ at the lower portion; the outer diameter of the post electrode is $\phi_D$; and the thickness of the upper and lower portions of the insulating ring 1 are represented by $t_1$ and $t_2$, respectively. It is assumed that $$\phi_B < \phi_A,$$

$$\phi_C < \phi_D, \text{ and}$$

$$t_2 < t_1.$$

When the metal disk 4 of diameter $\phi_A$ is inserted in the upper portion of the insulating ring 1, the ring 1 is expanded to the diameter $\phi_A$. This influences the lower portion of the insulating ring 1 and the inner diameter of the lower portion $t_2$ thick also is increased by about $(\phi_A - \phi_B)$. In this case, if the inner diameter $\phi_C$ of the lower portion of the insulating ring 1 is selected to be equal to or slightly smaller than the outer diameter of the metal post electrode 5, a play {l 2 as indicated in FIG. 3 is produced. Therefore, in order to prevent this play, the inner diameter $\phi_C$ of the lower portion of the insulating ring 1 is so determined that it satisfies $$\phi_C < \phi_D - (\phi_A - \phi_B)$$

When the metal post electrode 5 is inserted therein, the inner diameter of the lower portion of the insulating ring 1 is increased to $\phi_D$. By this fact a play $\Delta l_1$ as indicated in FIG. 4 can be produced at the upper portion of the insulating ring 1. However, since the thickness $t_1$ of the upper portion of the insulating ring is greater than $t_2$ and is sufficiently large, influences of the lower part don't affect the whole upper portion and thus deformation near the upper end of the insulating ring is restricted to an extremely small value, as indicated in FIG. 4. Consequently, according to this embodiment, the semiconductor substrate 3 on the metal disk 4 and the metal post electrode 5 are relatively fixedly positioned with a high precision owing to efficacious deformation of the insulating ring 1. In FIG. 2, the resin member 16 for protecting the end portion of the semiconductor substrate 3 is omitted for simplifying the presentation.

For the insulating ring 1 a material such as tetrafluoroethylene resin, silicone rubber, etc. is preferable.

Figure 5:
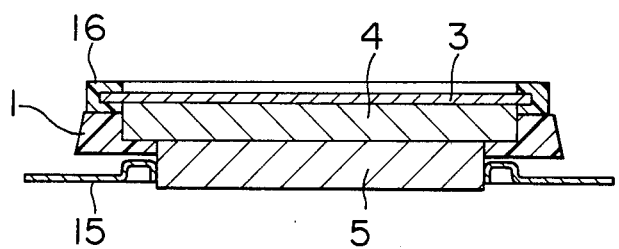
FIG. 5 is a cross-sectional view of a part of a GTO thyristor according to another embodiment of this invention.

FIG. 5 illustrate partly the structure of a GTO thyristor device according to another embodiment. According to this embodiment, the semiconductor substrate 3 is not alloyed with the metal disk 4, but simply located on the metal disk 4. In order to prevent lateral translation of the semiconductor substrate 3 and to protect the end portion of the semiconductor substrate 3, an insulating ring 16, e.g. of silicone rubber, is disposed on the semiconductor substrate 3 so that it is contacted with the upper portion of the side surface of the metal disk 4. The other structure is similar to that indicated in FIG. 1.

We claim:

1. A pressure contact semiconductor device comprising:
    a semiconductor substrate having an electrode film on each of parallel upper and lower principal surfaces and including a power semiconductor element structure between the upper and lower principal surfaces;
    a lower metal electrode plate, having an upper surface on which said semiconductor substrate is to be centrally placed such that the lower principal surface of said semiconductor substrate becomes securely positioned on the upper principal surface of said lower metal electrode plate, said lower metal electrode plate includes a material having a thermal expansion coefficient substantially equal to that of said semiconductor substrate;
    a lower post electrode having a high thermal conductivity and a high electrical conductivity including an upper surface on which said lower metal electrode plate is to be centrally positioned;
    an insulating ring elastically responsive to contact pressure and disposed in contact with and surrounding both said lower metal electrode plate and said lower post electrode at the periphery of both said lower metal electrode plate and said lower post electrode, said insulating ring including an upper part having a first thickness $t_1$ and having an inner diametric surface for contacting the periphery of only said lower metal different from said first thickness, and having an inner diametric surface for contacting the periphery of only said lower post electrode, the one of said upper and lower parts having a electrode plate and a lower part having a second thickness $t_{d2}$, smaller thickness being provided with greater radial width than the other of said upper and lower parts, said upper and lower parts of said insulating ring having respective inner diameters smaller than the diameter of said lower metal electrode plate and said lower post electrode, respectively, such that said upper and lower parts of said insulating ring continuously engage a respective periphery of said lower electrode plate and said lower post electrode even in response to a pressure force resulting in deformation of said insulating ring;
    an upper metal electrode plate positioned on the upper principal surface of said semiconductor substrate; and
    an upper post electrode positioned on the upper surface of said upper metal electrode plate.

2. A pressure contact semiconductor device according to claim 1, further comprising a sealing member means for sealing, insulating and fixedly positioning said upper and lower post electrodes.

3. A pressure contact semiconductor device according to claim 2, in which said sealing member has a resilience in the direction perpendicular to said principal surfaces of said semiconductor substrate.

4. A pressure contact semiconductor device according to claim 1, wherein said lower metal electrode plate is a disk having a diameter of length $\phi_A$; said lower post electrode is a disk having a diameter of length $\phi_D$, different from the diameter of said lower metal electrode plate; and said insulating ring upper part with a thickness $t_1$ having an inner diameter of length $\phi_B$ and engaging with said lower metal electrode plate at its periphery and said lower part with a thickness $t_2$ having an inner diameter of length $\phi_C$ and engaging with said lower post electrode at its periphery, where $t_1 > t_2$, and $\phi_A - \phi_B < \phi_D - \phi_C$.

5. A pressure contact semiconductor device according to claim 4, wherein the diametric length $\phi_A$ is greater than the diametric length $\phi_D$.

6. A pressure contact semiconductor device according to claim 1, wherein said electrode film on said lower principal surface of said semiconductor substrate is alloyed with said lower metal electrode plate.

7. A pressure contact semiconductor device according to claim 6, wherein said semiconductor body is Si and said electrode film and said lower metal electrode plate are made of Al and W, respectively.

8. A pressure contact semiconductor device according to claim 7, wherein said lower metal electrode plate is a disk having a diameter of length $\phi_A$; said lower post electrode is a disk having a diameter of length $\phi_D$, different from the diameter of said lower metal electrode plate; and said insulating ring upper part with a thickness $t_1$ having an inner diameter of length $\phi_B$ and engaging with said lower metal electrode plate at its periphery and said lower part with a thickness $t_2$ having an inner diameter of length $\phi_C$ and engaging with said lower post electrode at its periphery, where $t_1 > t_2$, and $\phi_A - \phi_B < \phi_D - \phi_C$.

9. A pressure contact semiconductor device according to claim 8, wherein the diametric length $\phi_A$ is greater than the diametric length $\phi_D$.

10. A pressure contact semiconductor device according to claim 7, wherein the diameter of said lower metal electrode plate is greater than the diameter of said lower post electrode.

11. A pressure contact semiconductor device according to claim 1, wherein said lower metal electrode plate is a disk having a diameter of length $\phi_A$; said lower post electrode is a disk having a diameter of length $\phi_D$, different from the diameter of said lower metal electrode plate; and said insulating ring upper part with a thickness $t_1$ having an inner diameter of length $\phi_B$ and engaging with said lower metal electrode plate at its periphery and said lower part with a thickness $t_2$ having an inner diameter of length $\phi_C$ and engaging with said lower post electrode at its periphery, where $t_1 < t_2$, and $\phi_A - \phi_B > \phi_D - \phi_C$.

12. A pressure contact semiconductor device according to claim 1, further comprising an insulating protection ring surrounding the end portion of said semiconductor substrate and being in contact with the periphery of said lower metal electrode plate.

13. A pressure contact semiconductor device according to claim 1, wherein the diameter of said lower metal electrode plate is greater than the diameter of said lower post electrode.

14. A pressure contact semiconductor device according to claim 1, wherein said insulating ring comprises an insulating resin ring.

15. A pressure contact semiconductor device according to claim 14, wherein said insulating ring is comprised of tetrafluoroethylene resin material.

16. A pressure contact semiconductor device according to claim 15, wherein said insulating resin ring is comprised of silicone rubber material.

17. A pressure contact semiconductor device comprising:
a semiconductor substrate having upper and lower principal surfaces;
a first metal plate having a first principal surface and having a thermal expansion coefficient close to that of said semiconductor substrate, wherein one of said upper and lower principal surfaces of said semicondutor substrate being centrally placed and securely contacting the first principal surface of said first metal plate;
a first metal post electrode having a principal surface disposed in contact with a second principal surface of said first metal plate;
a second metal plate having a first principal surface, disposed on the other one of said upper and lower substrate principal surfaces, and a second metal post electrode having a first principal surface placed in contact with a second principal surface of said second metal plate; and
a resin ring disposed in contact with said surrounding the periphery of both said first metal plate and said first metal post electrode for fixedly positioning said first metal plate and said first metal post electrode, said resin ring including a first portion having a first thickness and first radial width and having an inner diametric surface in contact with and surrounding the periphery of only said first metal plate, and a second portion having a second thickness and second radial width, different from said first thickness and first radial width, respectively, and having an inner diametric surface in contact with and surrounding the periphery of only said first metal post electrode, the inner diameter of said first portion being less than the diameter of said first metal plate and the inner diameter of said second portion being less than the diameter of said first metal post electrode in order to fix the relative position of said first metal plate and said first metal post electrode contacting surfaces as a result of a contact pressure force existing at the first metal plate and first metal post electrode peripheries with the resin ring first and second portions, respectively, and with only a slight deformation in the shape of the resin ring being effected.

18. A pressure contact semiconductor device according to claim 17, wherein the diameter of said first metal plate is greater than the diameter of said first metal post electrode.

* * * * *